United States Patent
Sachdev et al.

(10) Patent No.: US 6,351,871 B1
(45) Date of Patent: Mar. 5, 2002

(54) AQUEOUS QUATERNARY AMMONIUM HYDROXIDE AS A SCREENING MASK CLEANER

(75) Inventors: Krishna G. Sachdev; John T. Butler, both of Hopewell Junction; Michael E. Cropp, LaGrangeville; Donald W. DiAngelo, Fishkill; John F. Harmuth, Pleasant Valley; James N. Humenik, LaGrangeville; John U. Knickerbocker, Hopewell Junction; Daniel S. Mackin, Pleasant Valley; Glenn A. Pomerantz, Kerhonkson, all of NY (US); David E. Speed, Newton, CT (US); Candace A. Sullivan, Pleasant Valley, NY (US); Bruce E. Tripp, Rhinebeck, NY (US); James C. Utter, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/335,420

(22) Filed: Jun. 17, 1999

Related U.S. Application Data (62) Division of application No. 09/096,841, filed on Jun. 12, 1998, now Pat. No. 6,280,527.

(51) Int. Cl.[7] ............................................. A47L 25/00
(52) U.S. Cl. .......................... 15/322; 510/508; 134/63; 134/93; 134/95.3; 134/103.1
(58) Field of Search .......................... 15/302, 320, 322; 510/504, 245; 134/63, 93, 95.3, 103.1

(56) References Cited

U.S. PATENT DOCUMENTS

| | | | |
|---|---|---|---|
| 4,245,273 A | | 1/1981 | Feinberg et al. |
| 4,483,040 A | | 11/1984 | Magee et al. |
| 4,592,856 A | | 6/1986 | Kobayashi et al. |
| 4,964,919 A | | 10/1990 | Payne |
| 5,091,103 A | | 2/1992 | Dean et al. |
| 5,188,986 A | | 2/1993 | Liu et al. |
| 5,350,489 A | | 9/1994 | Muraoka |
| 5,407,788 A | | 4/1995 | Fang |
| 5,466,389 A | | 11/1995 | Hardi et al. |
| 5,472,513 A | | 12/1995 | Shiramizu |
| 5,498,293 A | | 3/1996 | Hardi et al. |
| 5,545,309 A | | 8/1996 | Shimizu et al. |
| 5,563,119 A | | 10/1996 | Ward |
| 5,888,308 A | * | 3/1999 | Sachdev et al. |
| 6,245,155 B1 | * | 6/2001 | Leon et al. |
| 6,277,799 B1 | * | 8/2001 | Sachdev et al. |
| 6,280,527 B1 | * | 8/2001 | Sachdev et al. |

OTHER PUBLICATIONS

"A Fabrication Technique for Multilayer Ceramic Modules" by H. D. Kaiser, F. J. Pakulski and A. F. Schmeckenbecher. IBM Components Division, East Fishkill Facility; Hopewell Junction, New York. Solid State Technology/May 1972; pp. 35–40.

* cited by examiner

Primary Examiner—Yogendra N. Gupta
Assistant Examiner—Gregory E. Webb (57) ABSTRACT

This invention relates to the cleaning of objects that relate to semiconductor printing, such as, for example, screening masks. This invention is basically directed to removing, for example, an organic polymer-metal composite paste from screening masks used in printing conductive metal patterns onto ceramic green sheets in the fabrication of semiconductor packaging substrates. More particularly, this invention is concerned with the automated in-line cleaning of paste screening masks with an aqueous alkaline solution of a quaternary ammonium hydroxide as a more environmentally friendly alternative to non-aqueous organic solvents-based cleaning in screening operations for the production multi-layer ceramic (MLC) substrates.

20 Claims, 4 Drawing Sheets

AQUEOUS QUATERNARY AMMONIUM HYDROXIDE AS A SCREENING MASK CLEANER

CROSS-REFERENCE TO RELATED PATENT APPLICATION

This Patent Application is a Divisional Patent Application of U.S. patent application Ser. No. 09/096,841, filed on Jun. 12, 1998 U.S Pat. No. 6,280,527.

FIELD OF THE INVENTION

This invention relates to cleaning of objects that relate to semiconductor printing, such as, for example, screening masks. This invention is basically directed to removing, for example, an organic polymer-metal composite paste from screening masks used in printing conductive metal pattern onto ceramic green sheet in the fabrication of semiconductor packaging substrates. More particularly, this invention is concerned with automated in-line cleaning of paste screening masks with aqueous alkaline solution of a quaternary ammonium hydroxide as an environmentally friendly alternative to non-aqueous organic solvents based cleaning in screening operations for the production multilayer ceramic (MLC) substrates.

BACKGROUND OF THE INVENTION

In the fabrication of multilayer ceramic substrates for packaging semiconductor devices, conductive metal patterns are screened on individual ceramic green sheets by printing, such as, extrusion printing, using mask, such as, a metal mask, placed in contact with the green sheet. The screen printing method involves squeeging paste onto the green sheet surface using a mesh mask or an emulsion mask. After screening, the green sheets-are assembled and aligned, and laminated followed by a sintering operation to form a multilayer ceramic substrate. Fabrication techniques for such substrates, including design, screening equipment, and paste screening process are well known in the art.

However, advance ground rule electronic packaging requires printing closely spaced conductive metal pattern on a substrate, and using a screening mask that has highly dense fine dimension etched features. It has been observed that such screening masks have the problem of paste residue entrapment in the mask features in addition to a surface residue when the paste is screened to deposit conductive pattern onto the green sheets. This requires that the metal mask be cleaned after one or more screening passes to eliminate/minimize the possibility of defects in subsequently screened pattern. Any defects in the screened paste pattern replicates into the final product causing yield losses. On the other hand, mesh masks can be used for multiple screening passes, typically 100–200 green sheets may be screened using the same mesh mask before it requires cleaning and therefore, the cleaning frequency for a mesh mark is relatively low in comparison to a metal mask.

Conductive pastes used in screening processes for the delineation of wiring, visa, I/O (input-output) pads, and other pattern features comprise metal particles with or without added inorganic particulate fillers. These constituents are mixed with an organic binder and solvent vehicle along with wetting agents, dispersants/surfactants, plasticizers, and other additives such as thickening agents, antioxidants, and coloring agents which are well known in the fabrication of electronic components.

Most commonly used conductive pastes in multilayer ceramic fabrication are based on molybdenum or tungsten metal powders dispersed in an organic polymer binder, such as, for example, ethyl cellulose, polymethylmethacrylate, and the like, or polyhydrocarbon based thermoplastic resins in a high boiling solvent vehicle.

Other conductive pastes that can be used for screening processes in multilayer ceramics could comprise copper, gold, nickel, tin, to name a few. Because of the variety and complex chemical make-up of polymer-metal pastes, it is required that the mask cleaning medium and process selected be such that it provides complete and efficient cleaning of all types of pastes from screening masks and associated equipment.

In automated processes for high volume production of multilayer ceramic substrates, it is also necessary that the speed of mask cleaning be compatible with the cycle time pre-set by the thruput requirement and other dependent operations.

Recently, several water-based cleaners have become commercially available and many aqueous detergent compositions have been described for cleaning/degreasing purposes, for example, printed circuit board assemblies and other parts in device fabrication to remove soldering flux, oil/grease, and other organic residues invariably formed during bonding and assembly processes in microelectronics. These are generally based on a combination of surfactants in water and/or alkaline detergent compositions comprising alkali metal salts, such as, sodium metasilicate, sodium carbonate, tribasic sodium phosphate, sodium tripolyphosphate, and combinations thereof, as well as highly alkaline solutions based on alkali metal salts, alkali metal hydroxides, and mixtures thereof with alkanolamines. Aqueous cleaner formulations comprising this category of alkaline detergents are described in U.S. Pat. No. 5,234,506 (Winston) and U.S. Pat. No. 5,264,047 (Winston) for removing soldering flux, wax, and grease from printed circuit boards.

One of the major considerations with aqueous cleaning is wastewater management for compliance with the Clean Water Act regulations, which requires that all possible sources of aquatic impact and other environmentally undesirable constituents be removed from the effluent before discharge to surface waters. This requires special and costly wastewater treatments, such as, precipitation with complexing agents to form sludge that carries active ingredients of cleaning compositions, metals, and other dissolved constituents, and which results in solids loading to the waste. To minimize waste and reduce cost with conservation of water in aqueous cleaning, there is currently significant industry direction toward environmentally suitable zero waste processes by devising a methodology for reclamation, recycling, reuse, etc.

U.S. patent application Ser. No. 09/096,849 filed on Jun. 12, 1998, entitled "REMOVAL OF SCREENING PASTE RESIDUE WITH QUATERNARY AMMONIUM HYDROXIDE-BASED AQUEOUS CLEANING COMPOSITIONS", assigned to the assignee of the instant Patent Application, and the disclosure of which is incorporated herein by reference, discloses the use of quaternary ammonium hydroxide-based aqueous cleaning compositions as a more environmentally friendly medium for removing screening paste residue.

PURPOSES AND SUMMARY OF THE INVENTION

The invention is a novel method of cleaning paste from screening masks using at least one aqueous quaternary ammonium hydroxide as a cleaner.

Therefore, it is a purpose of this invention to provide a water-based cleaning method for cleaning paste residue from screening masks used in the manufacturing of multi-layer ceramic substrates.

Another purpose of this invention is to provide an aqueous cleaning method for automated in-line cleaning of screening masks, in multi-layer ceramic manufacturing in high volume production.

Yet another purpose of this invention is to provide aqueous cleaning method for paste cleaning from screening masks, by using water-based solution of a quaternary ammonium hydroxide to eliminate volatile emissions and hazardous wastes associated with non-aqueous solvent based cleaning processes.

Still yet another purpose of this invention is to provide method for in-line mask cleaning with aqueous alkaline solution comprising a quaternary ammonium hydroxide as a single active ingredient which can be recovered and recycled.

Still another purpose of this invention is to provide aqueous alternative to organic solvents in mask cleaning by using an aqueous alkaline solution containing tetramethyl ammonium hydroxide that is effective in removing polar, non-polar, or hydrophilic and hydrophobic paste residue from metal and polymer surfaces.

It is also a purpose of this invention to provide an aqueous cleaning method for screening masks which does not require special wastewater treatment.

Yet another purpose of this invention is to provide an aqueous cleaning method for paste screening masks which provides an option for metals recovery from the effluent and minimizes waste in multilayer ceramic production.

Still another purpose of this invention is to provide an aqueous cleaning method using quaternary ammonium hydroxide containing compositions which are compatible with metal masks, emulsion masks, polymer adhesives used in mask assembly, and all contacting materials in cleaning tools associated with paste making equipment.

Still yet another purpose of this invention is to provide a cleaning method with an aqueous alkaline solution which is free of foaming problems when used under high pressure spray conditions.

Therefore, in one aspect this invention comprises an aqueous cleaning method for cleaning paste residue from at least one screening object comprising the use of at least one aqueous alkaline solution containing at least one quaternary ammonium hydroxide.

In another aspect this invention comprises a cleaning apparatus comprising:

(a) at least one means for pressurized spray cleaning of at least one screening object carrying screening paste residue with at least one solution; and (b) wherein said at least one solution comprises at least one aqueous alkaline composition having at least one quaternary ammonium hydroxide.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

This invention is basically concerned with a method of removing screening paste residue from screening masks and ancillary equipment used in screening conductive paste patterns on ceramic green sheet in the manufacture of multilayer ceramic substrates. This invention is particularly concerned with removing polymer-metal composite paste residue from screening masks in high throughput multi-layer ceramic production using an aqueous solution of a metal-ion-free organic base, specifically tetramethyl ammonium hydroxide (TMAH) and related organic quaternary ammonium hydroxides to provide a more environmentally friendly alternative to non-aqueous organic solvents cleaning processes.

Unless specified otherwise, the percentages given are in vol% (volume percent) and in wt % (weight percent).

The aqueous cleaning method according to this invention is environmentally friendly, and provides an option for the recovery of precious metals from the solid waste in the effluent. Aqueous cleaning with tetramethyl ammonium hydroxide according to this invention provides unique advantages of compatibility with recovery and recycling of the TMAH (tetramethyl ammonium hydroxide) and other quaternary ammonium hydroxides, reclamation of metals, and not requiring use of any surfactants or other additives, or alkali-metal silicates and/or phosphates.

The manufacturing of semiconductor packaging products, such as multilayer ceramic substrates, typically employs the technique of conductive pattern screening on a ceramic green sheet through a stencil mask using a variety of polymer-metal composite pastes to delineate conductive pattern for the desired circuitry. In this process, some paste residue is left behind on the surface and inside the fine etched features of the mask. The residue entrapped in the mask features and on the surface of the mask must be removed if the mask is to be reused for paste screening. Using automated screening and mask cleaning processes, mask cleaning may be done after one or more screening passes depending on whether the paste is fast drying or slow drying, otherwise the paste residue on the mask can cause defects in subsequently screened conductive patterns. Particular combinations of polar and/or non-polar polymer binders and solvent vehicle systems, which are selected for dispersing metal powders, determines the solubility and wettability characteristics of the resulting paste, which may range from hydrophilic to highly hydrophobic, and which may be fast drying or slow drying.

Selection of conductive screening pastes that are based on a variety of polymer binder-solvent vehicle systems is dictated by several considerations, viz, the requirement for a particular circuit pattern, drying characteristics of the paste, the shrinkage match of the paste with that of the ceramic, and the overall compatibility of the paste with the green sheet materials for the necessary wettability and adhesion.

Screening masks are typically made of metal, such as, etched Mo masks, electroform masks and emulsion masks for silk screening, such as, for example, a stainless steel mesh with at least one photoresist coating of a suitable emulsion such as a polyacrylic-polyester based emulsion coating.

As stated earlier, in the high volume production of multilayer ceramic substrates, an in-line screening and mask cleaning method using organic solvent pressurized spray is described in U.S. Pat. No. 4,483,040 (Magee), the disclosure of which is incorporated herein by reference.

The present invention provides a cleaning method for mask cleaning with aqueous quaternary ammonium hydroxide solution, specifically tetramethyl ammonium hydroxide (TMAH) and related quaternary ammonium hydroxides as an environmentally friendly alternative to non-aqueous organic solvents for the effective cleaning of polymer-metal composite paste residue in multilayer ceramic manufacturing.

Aqueous tetramethyl ammonium hydroxide (TMAH) is widely used in the semiconductor industry as a metal-ion-free resist developer in lithographic processes for integrated circuit device fabrication. Semi-aqueous cleaning compositions containing TMAH for the removal of baked photoresist residues, and for cleaning semiconductor wafers and wafer carriers have been known. For example, U.S. Pat. No. 5,407,788 (Fang) describes the use of TMAH in non-aqueous solvent for stripping cured negative resist patterns; U.S. Pat. No. 5,350,489 (Muraoka) teaches the use of quaternary ammonium hydroxide solutions for cleaning plastic molded items used in chemical analysis and wafer carriers to remove impurities of fine particles and fats and oils; U.S. Pat. No. 5,466,389 (Ilardi); and U.S. Pat. No. 4,964,919 (Payne) are concerned with cleaning silicon wafers using cleaning compositions at 8–10 pH comprising quaternary ammonium hydroxide related organic bases or alkali metal hydroxides in combination with surfactants and buffering agents, such as, acetic acid, ammonium chloride, and ammonium acetate, for adjusting pH to less than 10; U.S. Pat. No. 4,592,856 (Kobayashi) discloses the removal of oil/grease and resinous contaminants from the surface of plastic articles and molding equipment for eye glass lenses and optical instruments using detergent compositions comprising TMAH or 2-hydroxyethyl trimethyl ammonium hydroxide (Choline) in chlorinated solvents as perchloroethylene, 1,1,1-trichloroethane, methylene chloride, an ionic/non-ionic surfactant and methyl alcohol.

As stated earlier, the primary purpose of the present invention is to employ an aqueous-based cleaning alternative to organic solvents in automated mask cleaning to remove conductive screening paste residue. These pastes are used for defining via and wiring metallurgy patterns on ceramic green sheets and are comprised of a metal constituent, such as, molybdenum, copper, tungsten, nickel, gold, palladium, platinum and silver, some of which may also contain inorganic fillers, such as, glass, ceramic powder, or glass frit, dispersed in an organic polymer binder and a high boiling organic solvent vehicle along with other necessary additives which include surfactants/dispersants, coloring agents, thickening agents or viscosity modifiers, and antioxidants etc.

The invention may also be used to clean masks and screens which are used in the application of solder pastes to various microelectronics components.

Representative polymer binder systems in conductive paste formulations for multilayer ceramics include: cellulosic polymers, such as, ethylcellulose, acrylate polymers, such as, polymethylmethacrylate, polyhydrocarbon based thermoplastic resins which are all hydrophobic, or the binder can be hydrophilic such as hydroxyethyl cellulose, hydroxypropyl cellulose, hydroxymethyl cellulose, and the like.

The preferred high boiling solvent, vehicles having a low evaporation rate in paste dispersions include ester-alcohol or glycol ether type solvents such as 2,2,4-trimethylpentane diol, 1,3, monoisobutyrate (Texanol), diethylene glycol monomethylether acetate, diethylene glycol monobutylether acetate or butyl carbitol acetate (BCA), and the like. Generally, the solid component in screenable pastes comprises 60 to 85 percent (wt.%) metal constituent, 1 to 5 percent of organic polymer binder and other organic and inorganic additives, and the balance constituting the solvent vehicle system.

Depending on a particular binder-solvent vehicle system used in the paste formulation, the paste can be polar or non-polar, hydrophilic or oleophilic, have differences in affinity and adhesive characteristics for the mask surface, in addition to having differences in the drying rate.

According to this invention, it has been found that paste residue left on screening masks, in the process of conductive pattern screening on green sheet, is readily removed by pressure spray cleaning, with a dilute solution of tetramethyl ammonium hydroxide (TMAH) and/or related quaternary ammonium hydroxides. It was also found that pressure spray cleaning of masks with a heated dilute solution of TMAH provides reduction in cycle time. It was further found that mask cleaning using a high pressure spray of heated TMAH required a reduced concentration of TMAH and also provided a cycle time reduction. In mask cleaning with aqueous TMAH using a pressurized spray method, it is found that the minimum pH of aqueous TMAH solution must be at least above 11.5, preferably between about 11.8 and about 13.1, for it to be effective in the complete removal of the paste residue from the masks.

In one embodiment of this invention, Mo metal masks carrying conductive paste residue from a screening pass are spray cleaned with an aqueous TMAH $[(CH_3)_4N^+OH^-]$ solution comprising less than 1.0 wt. % TMAH dissolved in water, for about 30 to about 45 sec by using a hand-held spray nozzle or with a multi-nozzle spray at between about 50 and about 70 psi and between about 130° F. to about 150° F. solution temperature.

Subsequent to washing with TMAH, the screened masks are immediately rinsed with water and dried, preferably with forced hot air or nitrogen. In another embodiment of this invention, masks can be cleaned in less than about 15 sec to about 20 sec with less than about 1 wt % TMAH $[(CH_3)_4N^+OH^-]$ in water, using a high pressure spray wash employing a specially designed multi-nozzle system at between about 150 and about 200 psi and between about 130° F. and about 180° F. in an automated in-line paste screening and mask cleaning machine, such as, described in U.S. Pat. No. 4,483,040, and/or U.S. patent application Ser. No. 09/021046, (Casey) filed on Feb. 9, 1998, entitled "OPTIMIZED IN-LINE MASK CLEANING SYSTEM", the disclosure of which are incorporated herein by reference. High pressure spray wash under these conditions is especially preferred for automated screening and mask cleaning operations for the high volume production of multilayer ceramic substrates.

The cleaning tool employs a specially designed multi-nozzle spray head having top to bottom angled sets of nozzles that direct the spray on both sides of the mask simultaneously while sweeping across the mask in a pre-set time cycle. With this type of in-line mask cleaning machine, the cleaning process with aqueous TMAH typically involves a high pressure spray cleaning-at between about 100 and about 185 psi at between about 130 and about 180° F. for between about 10 and about 20 sec followed by a pressure spray rinse with water at between about 60 and about 70 psi in the same chamber or in a separate chamber 5 and then drying with an air knife or blow drying with nitrogen.

It was also found that high pressure spray cleaning at between about 170 and about 190 psi with a heated aqueous TMAH solution at a concentration, as low as about 0.3 wt %, also provides effective cleaning of various types of paste residues accompanied by longer wash times, followed by the usual water spray rinse and hot air or nitrogen drying.

Spray cleaning with aqueous TMAH as disclosed herein effectively and efficiently removes all types of paste residues that may include polar, non-polar, hydrophilic, and hydrophobic types of pastes from stencil masks, typically Mo metal, electroform masks, and emulsion masks.

Tetramethyl ammonium hydroxide (TMAH) is the preferred organic base for mask cleaning applications according to this invention but other related commonly known quaternary ammonium hydroxides that may also be used are: tetraethyl ammonium hydroxide, tetrabutyl ammonium hydroxide, trimethyl-2-hydroxyethyl ammonium hydroxide (Choline), triethyl-2-hydroxy ethyl ammonium hydroxide, ethyltrimethyl ammonium hydroxide, and the like.

The aqueous alkaline cleaning solution comprising quaternary ammonium hydroxides may optionally contain one or more corrosion inhibitor.

According to a preferred embodiment of this invention, a pressurized spray wash at between about 50 to about 200 psi with a heated aqueous solution of tetramethyl ammonium hydroxide (TMAH) containing between about 0.3 and about 2.0 wt % TMAH based on $(CH_3)_4N^+OH^-$ provided a highly effective cleaning of masks.

However, a high pressure spray at between about 100 psi and about 180 psi with a heated solution was preferred for the automated cleaning of stencil masks to remove conductive paste residue. This automated cleaning would provide a highly efficient process suitable for high volume production environment.

The overall cleaning process involves a pressure spray clean with aqueous TMAH which is immediately followed by a water spray rinse, and air or nitrogen drying operations to provide clean masks ready for use in the next screening and cleaning cycle. The volume of cleaning solution and water rinse per cycle per mask in the pressurized spray depends on the type of spray nozzles, the spray time, and the spray pressure. To accelerate the drying of masks after the water rinse cycle, the masks may be spray rinsed with a lower boiling solvent as isopropyl alcohol or simply exposed to its vapor and then air or nitrogen blow dried. The cycle time for cleaning can be further reduced by increasing the TMAH concentration, but this is not preferred due to a high pH concern, increased cost of cleaning and TMAH removal from the effluent before waste water discharge.

The effluent from the cleaning process described herein contains soluble and insoluble paste constituents and most of the original dissolved TMAH. It has been found that the metal and inorganic solids in the wash separate out in a form which can be readily removed by filtration. The filtered effluent after solids removal contains TMAH and dissolved organics of the paste residue removed from the masks.

Figure 1:
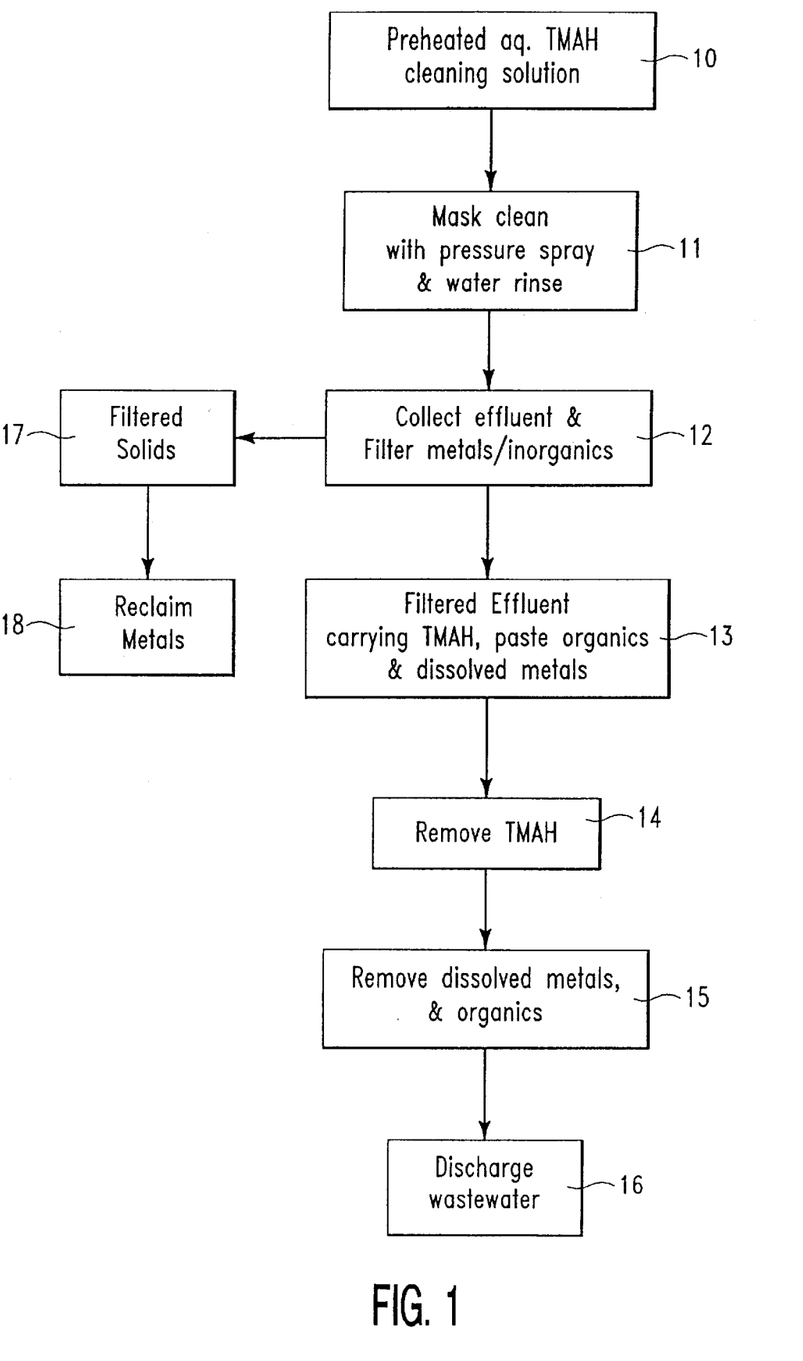
FIG. 1, illustrates a process flow chart for an embodiment of this invention using an aqueous tetramethyl ammonium hydroxide (TMAH) for cleaning a screening mask.

FIG. 1, illustrates a process flow chart for an embodiment of this invention using an aqueous TMAH for cleaning a screening mask. The TMAH cleaning solution made according to this invention is preferably preheated at step 10. The heated solution of step 10, is then used to clean a mask or any related equipment at step 11. This cleaning at step 11, can be done either manually or automatically. One could use a single or a multi-nozzle cleaning spray to do the cleaning of the screening parts. After the cleaning process it is preferred that the cleaned parts are rinsed with water and then dried to remove any surface water or moisture. The effluent from the cleaning process of step 11, is collected and filtered at step 12. At step 13, the filtered effluent from step 12, which contains dissolved, soluble TMAH, paste organics and any dissolved metals, etc. is collected. At step 14, one would remove the TMAH, from the filtered effluent of step 13. The dissolved metals and organics in the TMAH-free effluent after step 14, could be removed at step 15, leaving wastewater which would be discharged at step 16. It is preferred that at step 12, the solids are filtered out as step 17, and that the metals if any are reclaimed at step 18. Basically, the effluent generated in the pressure spray wash with aqueous TMAH at step 11, is filtered at steps 12, using a coarse filter, to remove solids, which include insoluble metals and inorganics, collected at step 17, and the filtered effluent is collected at step 13, which is followed by the removal of TMAH from the filtrate at step 14, for example, by ion-exchange resin. After the TMAH is removed at step 14, the wastewater can be further treated to remove any dissolved paste organics and soluble metals at step 15, for example, by passing through adsorbing media, activated charcoal, or lime treatment, following which wastewater can be safely discharged or reused at step 16. It is preferred that the filtered metal solids at step 17, are processed to reclaim precious metals, if any, at step 18. As shown in FIG. 1, the solids-free effluent can be further subjected to a process sequence for removing, TMAH, any dissolved metal, and organics, and to provide contaminant-free wastewater which may be safely discharged or reused.

Figure 2:
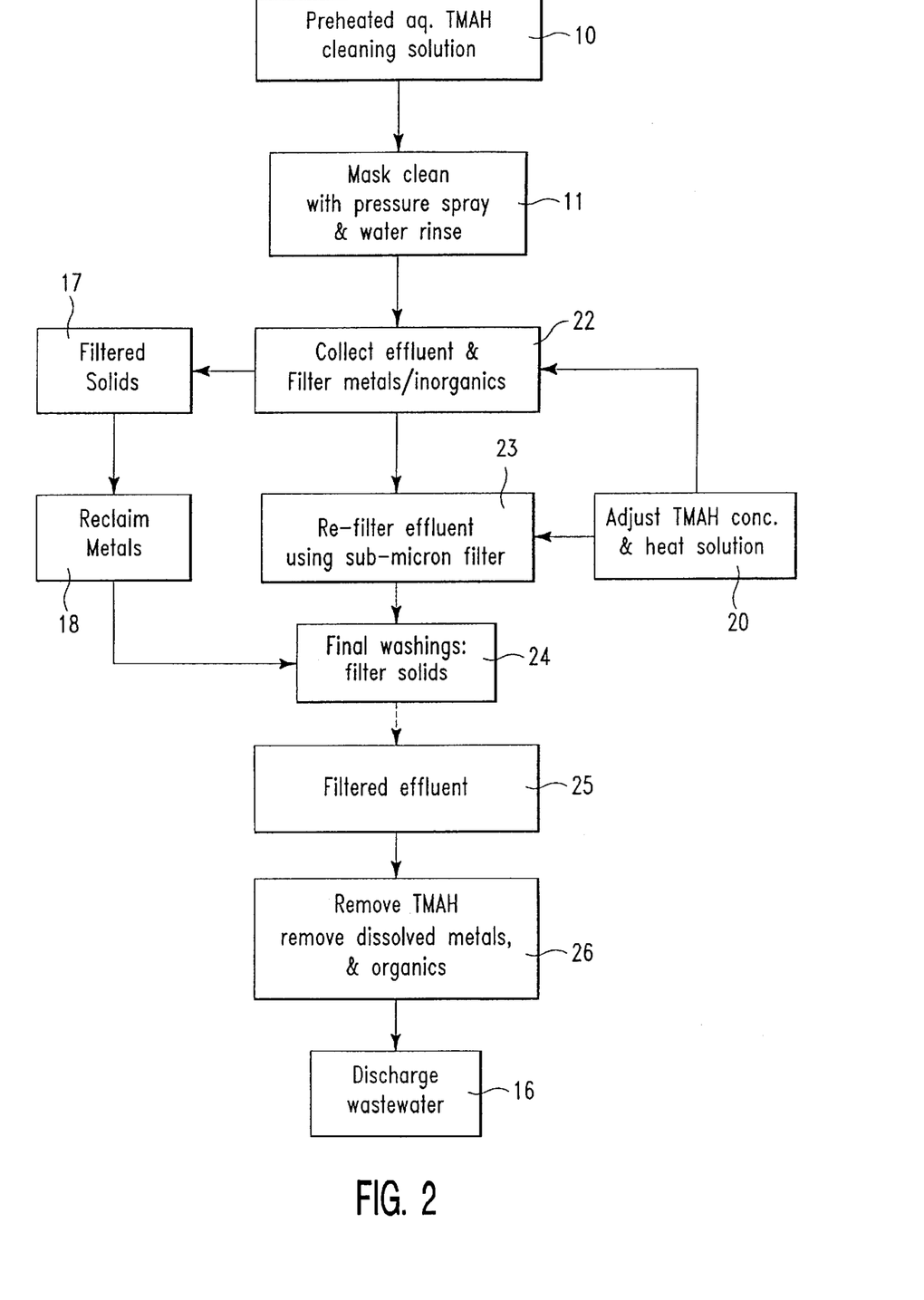
FIG. 2, illustrates a process flow chart for another embodiment of this invention where the effluent from the aqueous TMAH used for cleaning a screening mask is reused.

FIG. 2, illustrates a process flow chart for another embodiment of this invention where the effluent from the aqueous TMAH used for cleaning a screening mask is reused at least once again before waste discharge. The filtered effluent after step 11, at step 22, would be collected and would be subjected to microfiltration at step 23, and reused at least once after adjustment of the TMAH concentration at step 20, to make up for the dilution caused by mixing with the rinse water. At step 20, it is preferred that the adjusted TMAH solution is heated close to the same temperature as the original TMAH solution used in step 10, to clean the parts with once-used solution at step 11. The waste washing after reuse are filtered at step 24, to separate solids which are processed to reclaim metals in step 18, while the filtered effluent is collected at step 25. At step 26, one would remove TMAH dissolved metals and organics, and the wastewater would be discharged at step 16. It is preferred that the recovered filtered effluent of step 23, is only re-used once to prevent any degrading effect on the cleaning process due to increased dissolved paste organics, however, if the degradation of the process is not critical then the filtered effluent of step 23, could easily be used a multiple number of times. This mode of practicing the invention provides a number of benefits, such as, reduction in waste, reduced water consumption, reduced material cost, etc.

Figure 3:
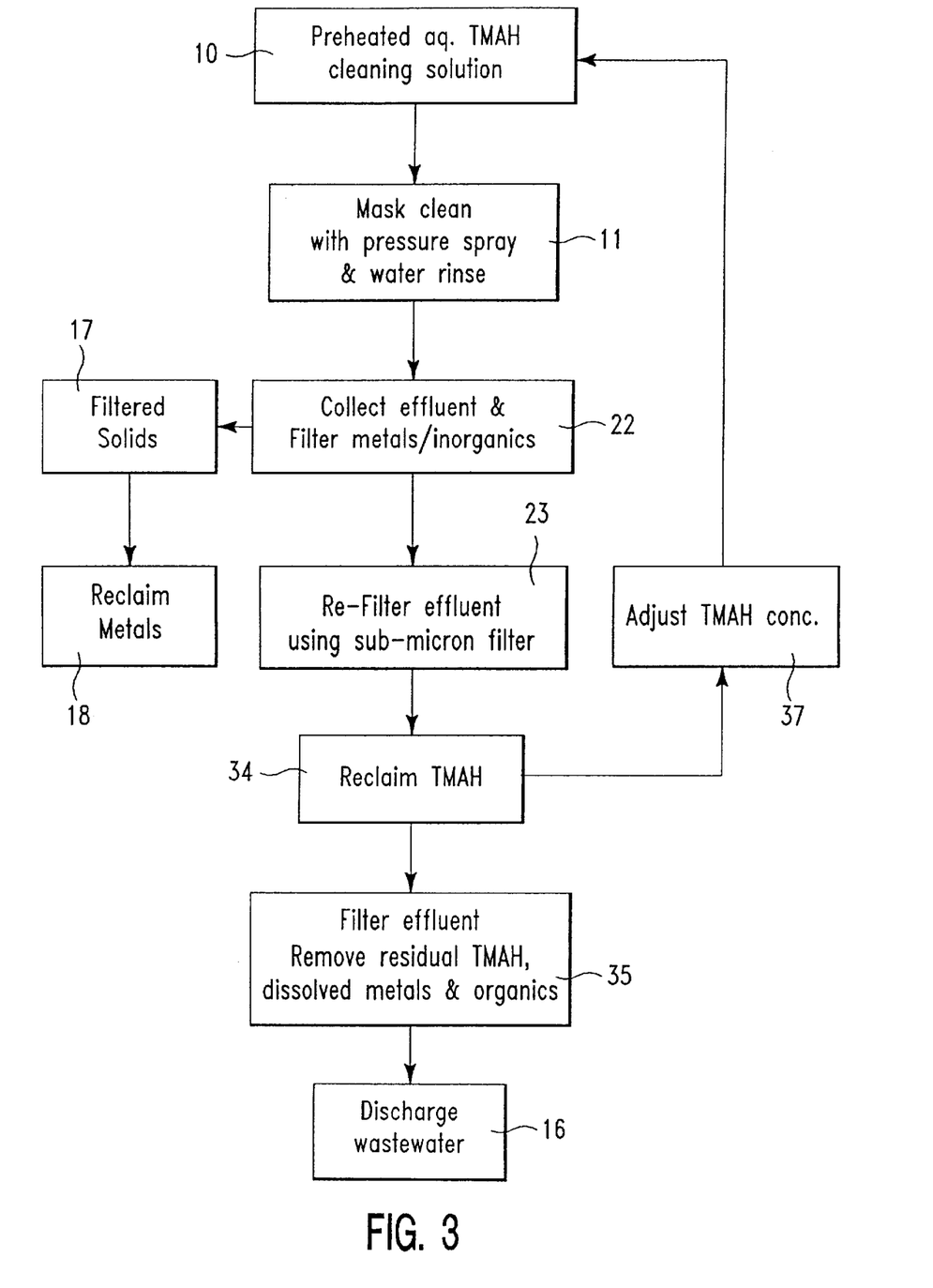
FIG. 3, illustrates a process flow chart for yet another embodiment of this invention where the TMAH used for cleaning a screening mask is reclaimed and reused.

FIG. 3, illustrates a process flow chart for yet another embodiment of this invention where the TMAH used for cleaning a screening mask is reclaimed and recycled. In this embodiment of the invention the filtered effluent at step 23, is subjected to a TMAH removal process at step 34, and the recovered TMAH is recycled back into step 10, for mask cleaning. However, it is preferred that the concentration of the recovered TMAH is adjusted at step 37, to make up the cleaning solution in step 10. The wastewater in this case may contain any of the remaining dissolved organics and/or soluble metals which can be removed by standard methods in step 35, for example, by passing through adsorbing media allowing the safe discharge of contaminant-free water in step 16.

Basically, as illustrated in FIG. 3, the filtrate after removing all solids from the effluent in step 22, is subjected to a process for recovery of TMAH in step 34. This TMAH recovery could be done, for example, by passing the TMAH solution through an ion exchange column to trap the TMAH followed by an elution step and the recovery of TMAH, and regeneration of the column for a repeat recovery cycle. Ion exchange methods for the removal and recovery of quaternary ammonium hydroxides are well known in the art, see for example, U.S. Pat. No. 5,545,309 (Shimizu), which is concerned with the processing of quaternary ammonium hydroxide-containing liquid waste and he describes a cation exchange method in conjunction with electrolysis to remove and purify TMAH from spent photoresist developer solutions. The TMAH recovery method of this invention also involves a TMAH absorbing step and an eluting step followed by processing the eluate to recover an aqueous solution of TMAH. The reclaimed TMAH may be recycled which reduces material cost and eliminates waste. Removal of the metals and the TMAH from the effluent, reclamation and recycling especially of TMAH according to the mask cleaning method disclosed herein using aqueous TMAH offers a major benefit in terms of minimizing waste, lowering costs, and the safe discharge of wastewater. In addition to TMAH recovery and recycling, the wastewater may be subjected to additional purification and also recycled in the cleaning process, thus providing a close-loop system, as more clearly discussed in FIG. 4. This mode of practicing the invention has the benefit of further reducing waste and reducing material and process cost.

Figure 4:
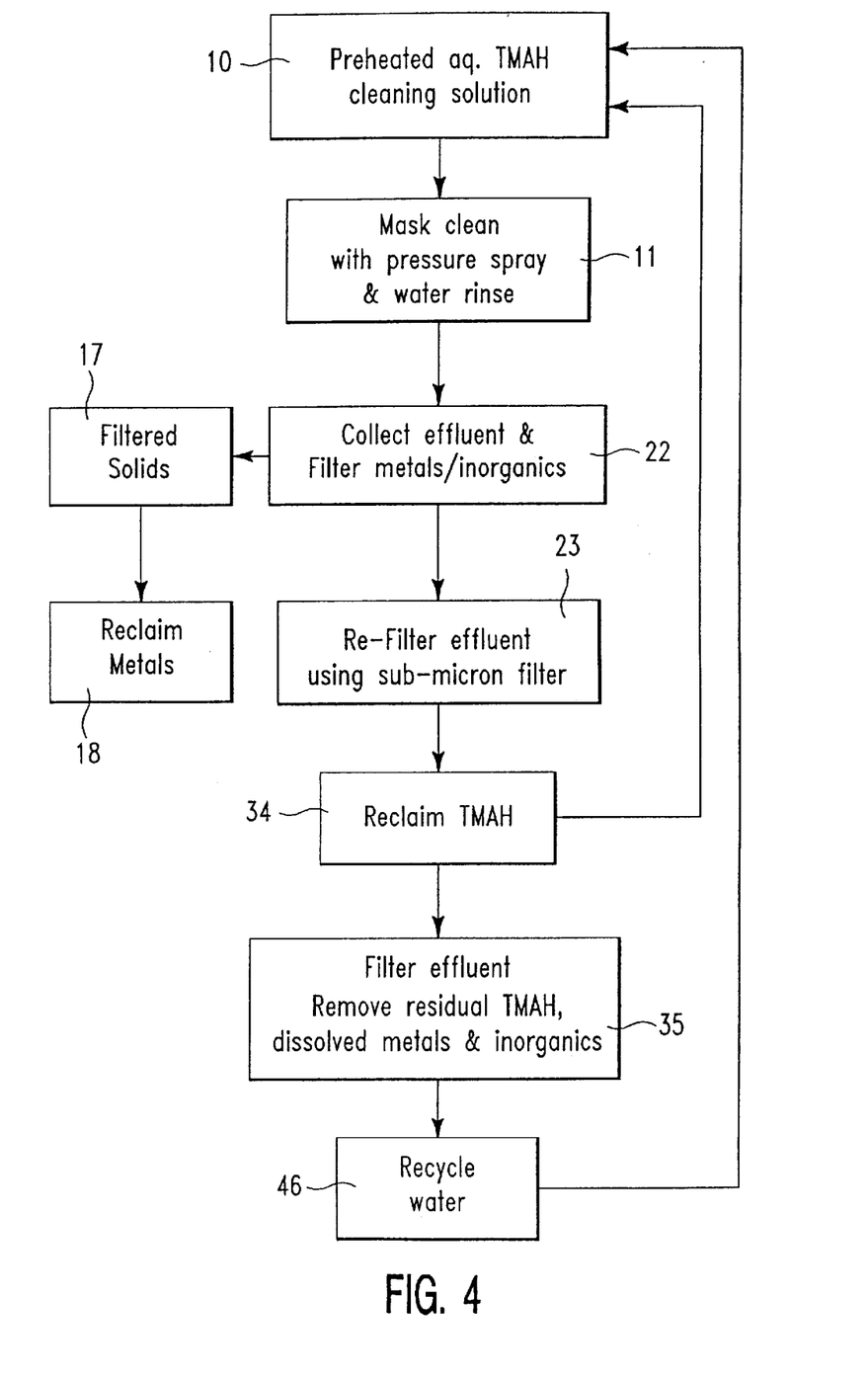
FIG. 4, illustrates a process flow chart for still another embodiment of this invention where the TMAH and the water used for cleaning a screening mask is reused or recycled.

FIG. 4, illustrates a process flow chart for still another embodiment of this invention where the TMAH and the water used for cleaning a screening mask is reused. This embodiment of the invention essentially provides a close-loop mask cleaning method. According to this mode, both the TMAH at step 34, which is the active ingredient in cleaning, and water at step 46, are recovered and reused. The rest of the material recovery process is the same as discussed earlier.

The wastewater after removal of the TMAH in the present invention may contain residual dissolved organics from the washed-off paste, for example, cellulosic polymer, fatty acid esters, sarcosinate type dispersants, which are generally biodegradable.

The mask cleaning method using aqueous TMAH without additives also has several advantages over the multicomponent aqueous alkaline solutions of the prior art comprising alkali metal silicates, phosphates, and surfactants. Specifically, such ingredients in the commonly known aqueous detergent compositions have environmental issues, require costly, waste-generating sludge forming wastewater treatment, and are not compatible with recovery from the effluent. These methods require the use of coagulants and flocculants, typically lime precipitation as Alum and iron salts, or PACls (polyaluminum chloride), organic polyelectrolytes etc, to precipitate silicates, phosphates, and other suspended matter from wastewater which adds solids to the waste. The 'sludge' or precipitated solids has associated disposal issues of landfill limitation, disposal cost, and if there is any heavy metal contamination, it becomes a hazardous waste requiring a higher cost of waste disposal.

EXAMPLES

Various aspects of the present invention are further illustrated by referring to the following examples which are intended only to further illustrate the invention and are not intended to limit the scope of the invention in any manner.

Example 1

Molybdenum metal masks having fine pitch etched features for via and wiring metallurgical patterns, and for I/O pads, suitable for multi-layer ceramic substrates were used for screening conductive pastes onto ceramic green sheets with a paste screening tool. Various conductive pastes used for screening in ceramic technology generally comprise of a metal powder as the predominant component in a polymer binder-solvent vehicle matrix. Representative pastes screened onto green sheets using the metal masks contained between about 60 to about 85 percent metal powder, typically Molybdenum, Copper, Tungsten, and Nickel, in ethylcellulose type polymer binders, and high boiling polar solvents, for example, 2,2,4-trimethylpentane diol 1,3-monoisobutyrate, or diethylene glycol alkylether acetate in conjunction with fatty acid ester based surfactant, thickening agents, and other additives like antioxidants, coloring agents, corrosion inhibitors, etc.

Also tested were non-polar conductive pastes based on low molecular weight thermoplastic resins derived from petroleum hydrocarbons as the binder in place of cellulosic binders in combination with a hydrocarbon oil as the solvent vehicle.

Some of the pastes tested, in addition to carrying metal powder as the major component also contained inorganic fillers, such as, glass, ceramic, $Al_2O_3$—$SiO_2$ glass-frit. After the paste screening operation, the masks carrying the paste residue on surface and inside the etched features were cleaned with an aqueous tetramethyl ammonium hydroxide (TMAH) solution as described in the following sub-examples:

(a) Pressurized spray cleaning of paste residue on Mo masks using a single nozzle manual spray technique:

An aqueous tetramethyl ammonium hydroxide (TMAH) solution having about 1 wt % based on $(CH_3)_4N^+OH^-$) was prepared by diluting about 150 ml of about 25 wt % TMAH concentrate to about 1 gallon by adding deionized water. The solution was heated to between about 130 to about 150° F. and manually sprayed on to masks carrying paste residue at between about 50 to about 70 psi pressure with a single nozzle for between about 35 to about 45 seconds which removed paste residue from all areas of the masks. Immediately after TMAH spray clean, the masks were spray rinsed with water, preferably deionized water, for between about 20 to about 30 seconds and dried by blowing nitrogen or hot air. Microscopic inspection of the cleaned masks showed no evidence of paste residue in any area of the masks.

(b) Mask cleaning with aqueous TMAH according to the process of Example 1, but using less than 1 wt % TMAH:

Masks carrying screening paste residue were cleaned with an aqueous tetramethyl ammonium hydroxide (TMAH) solution having about 0.6 wt % based on $(CH_3)_4N^+OH^-$) prepared by diluting about 370 ml of about 25 wt % TMAH concentrate, to about 4 gallons with deionized water. The solution was heated to between about 150 to about 160° F., and manually sprayed on to masks carrying paste residue, at between about 50 to about 70 psi pressure, for between about 40 to about 50 seconds, followed by a water rinse using spray at between about 30 and about 40 psi for about 30 seconds, and drying by blowing hot air. Microscopic inspection of the cleaned masks showed no evidence of paste residue in any area of the masks.

Example 2

Automated high pressure spray cleaning of screening masks with aqueous tetramethyl ammonium hydroxide (TMAH):

About a 0.5 percent solution (wt % based on total solution volume) of TMAH was prepared by diluting one gallon of about 25 wt % aqueous $(CH_3)_4N^+OH^-$) concentrate with deionized water to form about 50 gallon of aqueous TMAH cleaning solution. The solution was pre-heated to between about 130° F. to about 150° F. with constant agitation in a heated reservoir with delivery pipes connected to the cleaning tool. Freshly screened Mo metal masks having paste residue from screening of Mo paste were transported to the cleaning chamber a few minutes after the screening pass, and subjected to a high pressure spray wash at about 150 to about 170 psi with the heated TMAH solution, using between about 12 to about 20 second automated wash cycle, followed by a water rinse cycle, and a hot air blow dry. Microscopic inspection of the cleaned masks showed complete removal of residue from all areas of the mask.

This was done for all paste types, i.e., polar type pastes comprising ethylcellulose-ethyleneglycol alkylether acetate or ester-alcohol as the binder-solvent vehicle system, and the non-polar paste residue comprising hydrocarbon resin binder with non-polar oil as solvent vehicle.

Electroform masks having residue from screening of Cu, Mo and W pastes, when subjected to a similar cleaning procedure, showed complete removal of residue from all areas of the mask.

The following experimental results are representative of the cleaning effectiveness as a function of TMAH concentration, spray conditions, and wash cycle for a variety of pastes using an automated in-line screening and mask cleaning tool described in U.S. Pat. No. 4,483,040 (Magee) and U.S. patent application Ser. No. 09/021046, (Casey), filed on Feb. 9, 1998, entitled "OPTIMIZED IN-LINE MASK CLEANING SYSTEM", the disclosures of which are incorporated herein by reference:

| TMAH Conc. (percent) | Spray Pressure (psi) | Wash Cycle* (sec.) | Cleaning Results |
|---|---|---|---|
| 0.2 | 180–185 | 17 | marginal |
| 0.2 | 185–190 | 12 | poor |
| 0.3 | 180–185 | 17 | good |
| 0.3 | 180–185 | 10 | marginal |
| 0.4 | 180–185 | 12 | marginal |
| 0.4 | 180–185 | 15 | good |
| 0.5 | 170–185 | 12 | very good |
| 0.5 | 100–120 psi/140° F. | 12 | good |
| 2.0 | 150 psi/135° F. | 17 | very good |
| 0.6 | 150 psi/135° F. | 12 | very good |
| 0.6 | 120 psi/130° F. | 12 | very good |

*In all cases, TMAH solution was pre-heated to between about 140° F. to about 170° F., unless indicated otherwise.

Example 3

Automated high pressure spray cleaning with aqueous tetramethyl ammonium hydroxide (TMAH) with effluent reuse:

About 40 gallons of TMAH cleaning solution comprising about 0.5 wt. % of TMAH, was prepared by diluting about one gallon of about 25 wt % aqueous TMAH concentrate with about 49 gallons of deionized water. The solution was pre-heated to between about 160 to about 170° F. with constant agitation, in a reservoir with delivery pipes connected to the cleaning tool. Masks carrying screening paste residue were spray cleaned, water rinsed and dried according to the conditions described in Example 1. The wash and rinse from each mask was combined and filtered first through a 5–10 micron coarse filter to remove separated metal and inorganic solids, followed by microfiltration using about 0.2 micron cartridge filter. The filtered effluent was reconstituted to the original concentration of about 0.5 wt % TMAH by adding additional volume of the 25 wt % TMAH concentrate to make up for the dilution caused when the rinse water is combined with the wash, pre-heated and reused for cleaning another set of masks. Microscopic inspection of the cleaned masks showed no difference in the cleaning performance of the reconstituted effluent when compared with the masks cleaned according to Examples 1 and 2.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A cleaning apparatus comprising:
   (a) at least one means for pressurized spray cleaning of at least one screening object carrying screening paste residue with at least one solution; and
   (b) wherein said at least one solution comprises at least one aqueous alkaline composition having at least one quaternary ammonium hydroxide.

2. The cleaning apparatus of claim 1, wherein said at least one quaternary ammonium hydroxide is selected from the group consisting of tetramethyl ammonium hydroxide, tetraethyl ammonium hydroxide, 2-hydroxyethyl trimethyl ammonium hydroxide (Choline), ethyl-trimethyl ammonium hydroxide, tetrabutyl ammonium hydroxide, and mixtures thereof.

3. The cleaning apparatus of claim 1, wherein said at least one aqueous alkaline solution containing at least one quaternary ammonium hydroxide further comprises 2-hydroxyethyl trimethyl ammonium hydroxide.

4. The cleaning apparatus of claim 1, wherein said at least one screening object is selected from the group consisting of a metal mask, an electroform mask, or an emulsion mask on a metal mesh.

5. The cleaning apparatus of claim 1, wherein said paste residue comprises a metal and/or inorganic constituent with a polymeric binder, a solvent vehicle and a surfactant/dispersant, a thickening agent, and optionally at least one antioxidant, and/or at least one corrosion inhibitor.

6. The cleaning apparatus of claim 1, wherein said at least one aqueous alkaline solution comprises aqueous tetramethyl ammonium hydroxide (TMAH).

7. The cleaning apparatus of claim 6, wherein said aqueous TMAH solution comprises TMAH as an active ingredient based on $(CH_3)_4N^+OH^-$ in water at a concentration in the range of between about 0.3 wt % to about 2.0 wt %.

8. The cleaning apparatus of claim 6, wherein said aqueous TMAH solution comprises TMAH as an active ingredient based on $(CH_3)_4N^+OH^-$ in water at a concentration in the range of between about 0.3 wt % to about 1.0 wt %.

9. The cleaning apparatus of claim 6, wherein said aqueous TMAH solution is used for mask cleaning by pressurized spray with at least one spray nozzle, at a pressure of between about 40 to about 200 psi, and at a temperature of between about 130 to about 190° F., for less than about 1 min.

10. The cleaning apparatus of claim 6, wherein said aqueous TMAH solution is used for mask cleaning by a high pressure spray using at least one multi-nozzle spray system in an automated paste screening and mask cleaning machine.

11. The cleaning apparatus of claim 10, wherein said cleaning solution contains less than about 1 wt % of TMAH in deionized water.

12. The cleaning apparatus of claim 7, wherein said aqueous TMAH solution is used for cleaning according to a method comprising the steps of:
 (a) heating said solution of claim 7, at between about 130 to about 190° F. with constant agitation,
 (b) spraying said heated solution for between about 10 to about 20 seconds on said at least one screening object carrying at least one paste residue from at least one screening pass, using at least one high pressure spray wash, at a pressure of between about 70 to about 200 psi, with at least one multi-nozzle spray head, that sweeps across said object,
 (c) spray rinsing said object with hot water immediately following step (b) using said multi-nozzle spray head, at a pressure of between 50 to about 100 psi, for between about 10 to about 20 seconds, to remove any TMAH from said object.

13. The cleaning apparatus of claim 12, wherein said object is dried with forced air or nitrogen.

14. The cleaning apparatus of claim 12, wherein said tetramethyl ammonium hydroxide is removed from the effluent, reclaimed and recycled.

15. The cleaning apparatus of claim 12, wherein the wastewater after removing TMAH from the effluent is purified and recycled to provide a close-loop aqueous cleaning method for screening objects.

16. The cleaning apparatus of claim 12, wherein the effluent is microfiltered and reused before subjecting to TMAH removal operation.

17. The cleaning apparatus of claim 1 wherein said cleaning paste comprises of at least one solder paste.

18. The cleaning apparatus of claim 1, wherein said paste comprises of a metal constituent selected from a group consisting of molybdenum, copper, tungsten, nickel, gold, palladium, platinum and silver.

19. The cleaning apparatus of claim 1, wherein said paste comprises of an inorganic filler selected from a group consisting of glass, ceramic powder and glass frit.

20. The cleaning apparatus of claim 1, wherein said paste comprises an organic polymer binder and a high boiling organic solvent.

* * * * *